United States Patent [19]

Jasani

[11] 4,139,436
[45] Feb. 13, 1979

[54] POLYETHERURETHANE COMPOSITION AND POLYMER PREPARED BY PHOTOPOLYMERIZATION

[75] Inventor: Shirish R. Jasani, Akron, Ohio

[73] Assignee: The Goodyear Tire & Rubber Company, Akron, Ohio

[21] Appl. No.: 766,321

[22] Filed: Feb. 7, 1977

[51] Int. Cl.$^2$ .................. C08B 18/00; C08B 63/00
[52] U.S. Cl. ........................... 204/159.16; 96/35.1;
 204/159.15; 204/159.19; 260/23 TN; 260/23 AR; 260/859 R; 427/54; 528/67; 528/75
[58] Field of Search .............. 204/159.15, 159.19, 204/159.16; 528/67, 75; 260/859 R

[56] References Cited

U.S. PATENT DOCUMENTS

| | | | |
|---|---|---|---|
| 3,782,961 | 1/1974 | Takahashi et al. | 204/159.16 X |
| 3,926,755 | 12/1975 | Marans et al. | 204/159.15 |
| 4,006,024 | 2/1977 | Ibata et al. | 204/159.15 X |

*Primary Examiner*—Richard B. Turer
*Attorney, Agent, or Firm*—J. D. Wolfe

[57] ABSTRACT

A liquid ethylenically unsaturated polyetherurethane composition having a viscosity at 24° C. of 1000 to 10,000 centipoises dispersible in dilute aqueous sodium hydroxide is capable of being polymerized by actinic light to yield a solid having a Shore A hardness of at least 30 when the composition contains 0.5 to 15 percent dialkyl, aminoalkyl, acrylate or methacrylate. The resulting polymer is capable of taking on excellent halftone or half dot quality.

9 Claims, No Drawings

POLYETHERURETHANE COMPOSITION AND POLYMER PREPARED BY PHOTOPOLYMERIZATION

This invention relates to an improved liquid ethylenically unsaturated polyetherurethane composition characterized by its ability to be polymerized to a solid under ultraviolet light activation to give a printing plate capable of reproducing the finer halftone dots of a print negative. More specifically this invention relates to an improved water soluble liquid ethylenically unsaturated polyurethane composition suitable to coat substrates.

Photopolymers have been taught and used in making plates for printing such as letter press or gravure plates or the so-called relief plates. The compositions utilizable heretofore contained a relatively large amount of volatile unsaturated photocurable monomers which had to be removed during the preparation of the plates and appreciably contaminated the atmosphere as well as the material being used to wash the unpolymerized polymer away from the polymerized polymer during the preparation of the printing plate.

Polyurethane polymerizable compositions have been taught by the following patents: U.S. Pat. Nos. 3,658,531, 3,677,920, 3,713,864, 3,782,961, British Patent No. 1,321,108 and Japanese Patent No. 41,708/73, but unfortunately, these polyurethane photopolymerizable compositions have had extremely high viscosities and were not readily washed or removed from the polymerized material during the preparation of the printing plates.

Although the liquid photopolymers have been used extensively to make printing plates, these plates did not have the finer halftone quality needed to produce printed matter of the quality obtained with lithographic metal plates.

It is an object of this invention to provide a liquid polyetherurethane composition characterized by the ability to produce printing plates having better halftone characteristics.

Base photopolymer compositions in accordance with this invention can be prepared by forming a polyurethane by reacting a polyether polyol having 2 or 3 hydroxyls, with an organic polyisocyanate and a hydroxy alkyl methacrylate or acrylate where the alkyl radical has 2 or 3 carbon atoms. This reaction may occur in the presence of a diluent, preferably comprising a polyethylene polyol acrylate or methacrylate of 200 to 6000 and preferably 500 to 1500 molecular weight of polyethylene polyol with 2 to 4 hydroxyls and preferably in the presence of an organic tin catalyst and an antioxidant. Alternately, the isocyanate may be reacted and then the diluent, the photosensitizing agent, and preferably a fatty acid or a fat can be added thereto to obtain the liquid polymer composition. Generally, this composition has a viscosity of between about 2000 and 10,000 centipoises at 24° C. and preferably between about 3,000 to 6,000 centipoises. This liquid photopolymer composition containing an initiator can be applied to a substrate and exposed to ultraviolet light of wavelengths of approximately 3000 to 4000 Angstrom units to readily effect polymerization of the polymer in those areas receiving the ultraviolet light to produce the desired printing plate when the unexposed polymer is removed. It should be understood that the ultraviolet light passes through a suitable image imparting medium before striking the photopolymerizable composition. The composition on the substrate after its exposure to ultraviolet light can be washed with slightly alkaline water (preferably 0.5 to 2 normal sodium hydroxide) or water containing a suitable detergent to remove the unpolymerized composition to leave a solid polymerized composition on the substrate to yield a printing plate. Alternately, the unpolymerized polymer may be removed by vacuum or pressurized air.

Although the base composition gives good printing plates, the halftone quality of the printed matter is greatly improved to more nearly approximate the quality obtained with lithographic metal plates by incorporating 0.5 to 15, and preferably 2 to 6 percent by weight of dialkyl aminoalkyl acrylate or methacrylate where the alkyl radicals contain 1 to 10 carbon atoms; preferably the alkyl radical attached to the acrylate or methacrylate radical contains 2 to 10 carbon atoms. The alkyl radical having 2 carbon atoms gives better solubility under normal operating conditions. The dialkylamino alkyl acrylate or methacrylate can be added to the base composition after its preparation or any time during preparation of the base composition, such as by addition to polyetherpolyol or the hydroxyl alkyl acrylate or methacrylate prior to their reaction with the isocyanate or afterwards. Also, the diluent can be omitted when this additive is used.

The nature of this invention may be more readily understood and appreciated by reference to the following representative examples wherein all parts and percentages are by weight unless otherwise indicated.

EXAMPLES I THROUGH VI

The base compositions were made by the recipes of Table 1:

Table 1

| Example No. | Parts | | | | | |
|---|---|---|---|---|---|---|
| | 1 | 2 | 3 | 4 | 5 | 6 |
| Polyether diol* | 2000 | 2000 | 1600 | 1600 | 800 | 800 |
| Isophorone diisocyanate | 883 | 883 | 772 | 772 | 175 | 189 |
| Trimethylhexamethylene diisocyanate | — | — | — | — | 166 | 178 |
| Hydroxyethyl methacrylate | 1101 | 1101 | 760 | 760 | 436 | 470 |
| Polyethylene glycol 600 dimethacrylate | 200 | 200 | 158 | 158 | 80 | 80 |
| Oleic Acid | 104 | 104 | 95 | 95 | 50 | 50 |
| Photosensitizer Agent | BIBE 174 | DEAP 174 | BIBE 158 | DEAP 158 | BIBE 80 | BIBE 80 |
| Hydroquinone | 1.0 | 1.0 | 4.0 | 4.0 | 2 | 2 |

Table 1-continued

| Example No. | Parts | | | | | |
|---|---|---|---|---|---|---|
| | 1 | 2 | 3 | 4 | 5 | 6 |
| Catalyst-T-831** | 4.0 | 4.0 | 3.0 | 3.0 | 1.5 | 1.5 |

*These polyether diols have molecular weights of 3000 in Examples 1, 2, 5 and 6 and 1800 in Examples 3 and 4.
**Catalyst-T-831 is di(n-octyl)tin-S,S'-bis-(isooctyl mercaptoacetate).

In the table the recipe set forth for Examples 1, 2, 5 and 6 were mixed in the following order, namely, the polyether diol was placed in a suitable reaction kettle, then the isocyanate and the polyethylene glycol 600 dimethacrylate, where the 600 indicates the molecular weight of the polyethylene glycol, along with the hydroquinone was added to the polyether diol. The mixture was degassed at room temperature for one hour and then the hydroxy ethyl methacrylate was added with stirring continuing for 10 minutes at atmospheric pressure. The catalyst was then added to the reactor and stirred for five minutes. The temperature of the reaction mixture was controlled by cooling the reaction vessel to see that the temperature did not rise above 77° C. The reaction mixture was allowed to stand for approximately 48 hours at room temperature after the exotherm had subsided and the resulting reaction product was analyzed for residual isocyanate content and usually was found to contain less than 0.5 percent free NCO. This free NCO content was then destroyed by the addition of the theoretical amount or a small excess of n-butanol to stabilize the viscosity of the resulting reaction product to produce a gum stock. For instance, the product obtained by Example 1 had a viscosity of 3200 centipoises at 24° C. after it had been stabilized by the addition of n-butanol and was substantially free of any offensive odor. The photosensitizing agent was added to this mixture in the amounts called for by the recipe and then the liquid photopolymerizable composition, for instance, the one of Example 1, was submitted to ultraviolet cure and the cured composition had a Shore A hardness of 95. In Example 4 the polyether diol, isophorone diisocyanate, hydroxyethyl methacrylate were first reacted to form the polyurethane and after standing for approximately 48 hours the free NCO was determined and destroyed by the addition of sufficient n-butanol to give a composition which was essentially free of isocyanate, then the oleic acid, polyethylene glycol 600 dimethacrylate and the photosensitizing agent, viz. DEAP, the abbreviation for 2,2-diethoxyacetophenone was added and stirred into the stabilized urethane mixture of Example 4 to give a photopolymer composition having a viscosity of 4100 centipoises at 24° C. This composition was substantially free of any offensive odor and could be readily cured upon exposure to ultraviolet light to produce a polymer on the substrate that was satisfactory as a printing plate and by using an aqueous detergent solution the unpolymerizable composition was readily removed from the polymer on the substrate.

In Examples 1, 2, 3, 4 and 5 above the polyether diol was one containing essentially 70 percent of the groups being derived from propylene oxide and 30 percent of its groups being derived from ethylene oxide and having approximately 80 percent primary hydroxyl groups. The polyether diol of Example 6 contained approximately 92 percent groups derived from propylene oxide and 8 percent of groups derived from ethylene oxide to yield a diol having approximately 59 percent primary hydroxyl groups. The photosensitizer identified in Examples 1, 3, 5 and 6 as BIBE is benzoin isobutyl ether.

The base compositions of Examples 1 to 6 were modified by intimately mixing 9.0% by weight of diethyl amino ethyl acrylate to give a liquid photopolymerizable composition that produced printing plates having much improved halftone qualities, even dots less than 4 mils in diameter upon exposure to ultraviolet light. Also, these liquid photopolymerizable compositions were characterized by rapid polymerization and thus required shorter ultraviolet light exposure for development of the desired tonal qualities of the printing plate.

EXAMPLE VII

To 100 parts of the base composition from Example 2, Table 1 was added 5 parts diethyl amino ethyl acrylate (DEAEA). This modified liquid photopolymer was compared with its base composition for curing characteristics under UV (ultraviolet) light. The photopolymer was exposed to a UV light through a test negative from a continuous tone Carleson Grey scale (i.e. Gammatrol target having 0.004 inch to 0.008 inch dots in 50 steps). An 8 KW (kilowatt) pulsed Xenon UV lamp provided the actinic radiation. The photopolymer was first exposed directly to UV light for very short duration, i.e., given a bump exposure. These exposure times depend upon the curing characteristic of each polymer and usually last as long as 5 seconds or as little as one-half a second. This bump exposure serves to initiate or activate the photosensitizer and hastens the curing process of the polymer. The polymer is then exposed (viz. the main exposure) to UV light through the Gammatrol test negative. This exposure time is varied to study the curing characteristic. After exposure to main actinic radiation the liquid polymer is washed off with an aqueous detergent solution. Table 2 compares the results between the base composition and the modified composition, i.e. the one containing 5 parts DEAEA.

Table 2

| Exposure time | Base Composition | | Modified Composition | |
|---|---|---|---|---|
| Bump (seconds) | 4.00 | 4.00 | 1.60 | 1.60 |
| Main (minutes) | 1.00 | 1.50 | 1.00 | 1.50 |
| Space, Print Rating | | | | |
| Gammatiol Number | 17 | 14 | 6 | 1 |
| Minimum dot size, inches | 0.007 | 0.0067 | 0.0047 | 0.004 |

The above experiment clearly shows that adding 5 parts diethyl aminoethyl acrylate to the base composition produces a photopolymer capable of reproducing very fine halftone dots which are a prerequisite to printing good photographs on a newspaper page.

In a trial run, 100,000 copies were printed with a printing plate made from the above modified composition at the exposure times shown in Table 2. The halftone quality of the printed copies were essentially as good as offset printed copies.

EXAMPLE VIII

Aliquots (100 parts) of the base composition of Example 2 were intimately mixed with 5 parts of the dialkylaminoalkyl acrylates or methacrylates identified in Table 3 to produce modified compositions A to D and then exposed to UV radiation, viz. bump and main, for the time shown and the liquid polymer was washed away after the main exposure to give a printing plate. The main exposure was through a Letterflex ® Machine test negative comprising a continuous tone Carlson gray scale negative, generally called a Gammatrol target, as shown in the Letterflex ® Systems procedure for evaluating halftones or print quality.

The test plates so produced are rated in Table 3 according to the Gammatrol Number rating which varies from 1 to 14 and higher. Generally, the relationship between Gammatrol Number and minimum dot size is shown in Table 4.

Table 3

| Modified Composition | Modifier | Actinic Radiation Exposure, Time | | Gammatrol No. |
|---|---|---|---|---|
| | | Bump (Sec.) | Main (Min.) | |
| A | Diethylamino ethyl acrylate | 1.70 | 1.50 | 1 |
| | | 1.70 | 2.00 | 1 |
| B | Dimethylamino ethyl acrylate | 2.30 | 1.50 | 3 |
| | | 2.30 | 2.00 | 1 |
| C | Diethylamino ethyl methacrylate (DEAEMA) | 1.70 | 1.50 | 1 |
| | | 2.15 | 2.00 | 1 |
| D | Dimethylamino ethyl methacrylate | 1.90 | 1.50 | 2 |
| | | 2.15 | 2.00 | 1 |

These modified compositions A to D produced printing plates having a tonal quality which would be excellent for printing the advertising section of a newspaper.

Table 4

| Gammatrol Number | Minimum Dot Size, in Mils |
|---|---|
| 1 | 4.25 |
| 4 | 4.6 |
| 6 | 4.75 |
| 8 | 4.96 |
| 14 | 6.73 |
| 17 | 7.08 |

The dialkyl amino alkyl acrylate or methacrylates can be added to or formed in situ with the compositions of Ser. No. 617,883 filed Sept. 29, 1975 now U.S. Pat. No. 4,057,431 in amounts of 0.5 to 15 and preferably 3 to 8 parts per 100 parts to give liquid photopolymers capable of yielding printing plates having good to very good halftones characterized by Gammatrol numbers of 1 to 10 and at 3 to 6 parts the Gammatrol number or rating will be 1 to 4.

The foregoing examples have been exemplified with reactive hydroxy ethylenic monomers of the class of hydroxy alkyl acrylate or methacrylate but the hydroxy alkoxy acrylates or methacrylates where the alkoxy is a radical containing from 1 to 10 repeating groups of the formula ($-C_2H_4O-$) or ($-C_3H_6O-$) may be used, too.

EXAMPLE IX

A series of experiments were made by using toluene diisocyanate (TDI) alone and in combination with isophorone diisocyanate (IPDI) to make photopolymer according to the recipes of Table 5:

Table 5

| Ingredients by Parts | 9A | 9B | 9C | 9D | 9E |
|---|---|---|---|---|---|
| Polyether diol | 400 | 400 | 400 | 400 | 400 |
| IPDI | 179 | 134.3 | 89.5 | 44.75 | — |
| TDI | — | 35.1 | 70 | 105 | 140.3 |
| Hydroxylethyl methacrylate | 223 | 223 | 223 | 223 | 223 |
| Polyethylene glycol methacrylate | 40 | 40 | 40 | 40 | 40 |
| Hydroquinone | 0.2 | 0.2 | 0.2 | 0.2 | 0.2 |
| Phenolic antioxidant | 0.4 | 0.4 | 0.4 | 0.4 | 0.4 |
| Butanol | 8.8 | 8.8 | 8.8 | 8.8 | 8.8 |

A 100 part aliquot of the polymers of Runs 9B, 9C and 9D were compounded with 5 parts of DEAP and 5 parts DEAEMA. The Brookfield viscosity (Spindle No. 4) at room temperature on these compounded aliquots were run and found to be in the range of 2400 to 2900 centipoises where the uncompounded aliquots had viscosities of 6000 to 7000 centipoises. Therefore, it should be noted that the dialkylamino acrylate or methacrylate not only improves the halftone of the letter press plate and reduces UV exposure time but reduces the viscosity of the base polymer to give greater freedom in the base polymer manufacture. Hence, in many cases there is no need for a diluent.

Also, it should be noted that any of the alcohols of 1 to 20 carbon atoms could be used instead of n-butanol to neutralize the free NCO content of the reaction product of the polyol and organic polyisocyanate to give a gum stock. Since the polymer molecular weight can be controlled to give a liquid gum stock, this permits the photopolymer composition to be produced and compounded to yield a controlled viscosity.

While certain representative embodiments and details have been shown for the purpose of illustrating the invention, it will be apparent to those skilled in this art that various changes and modifications may be made therein without departing from the spirit or scope of the invention.

What is claimed is:

1. In a liquid ethylenically unsaturated polyetherurethane composition having no free NCO, a viscosity at 24° C. of 1,000 to 10,000 centipoises, dispersible in dilute aqueous sodium hydroxide and capable of being polymerized by actinic light to yield a solid having a Shore A hardness of at least 30, the improvement wherein said composition contains 0.5 to 15 percent of dialkyl aminoalkyl acrylate or methacrylate, said alkyl radical containing 1 to 10 carbon atoms said improved composition being capable of producing a printing plate having fine half-tone dots.

2. The polyetherurethane of claim 1 wherein the carbon to oxygen ratio of polyether portion of the polyetherurethane is greater than 2.0 but less than 3.0.

3. The polyetherurethane composition of claim 1 containing 10 to 85 percent of an ethylenic monomer on the composition basis, said monomer being a hydroxy alkyl acrylate or methacrylate, with said alkyl radical containing 2 to 3 carbon atoms or being a hydroxyalkoxy acrylate or methacrylate where the alkoxy is a radical containing from 1 to 10 repeating groups of the formula ($-C_2H_4O-$) or ($-C_3H_6O-$).

4. The polyetherurethane composition of claim 1 which contains a photosensitizer.

5. The polyetherurethane composition of claim 4 containing sufficient diluent to give the composition a viscosity at 25° C. of 3,000 to 6,000 centipoises and the diluent is polyethylene ether polyol acrylate or methacrylate where polyethylene ether polyol has a molecular weight of 200 to 6000.

6. The polyetherurethane composition of claim 4 wherein the photosensitizer is benzoin isobutyl ether or 2,2-diethoxyacetophenone.

7. The polyurethane composition of claim 1 wherein the dialkyl radical is diethyl or dimethyl and the composition is curable with ultraviolet light to produce a printing plate having fine half-tone dots.

8. The composition of claim 1 wherein the polyetherurethane is a reaction product of isophorone diisocyanate.

9. The composition of claim 1 wherein the dialkyl aminoalkyl acrylate or methacrylate is diethylamino ethyl acrylate or methacrylate.

* * * * *